(12) United States Patent
Jesus Teixeira et al.

(10) Patent No.: US 10,326,529 B2
(45) Date of Patent: Jun. 18, 2019

(54) PHOTONIC INTEGRATED TUNABLE MULTI-WAVELENGTH TRANSMITTER CIRCUIT

(71) Applicant: ALTICE LABS, S.A., Aveiro (PT)

(72) Inventors: António Luís Jesus Teixeira, Ílhavo (PT); Ana Cristina Maia Tavares, Moldes (PT); Ana Patricia Silva Lopes, Viseu (PT); Cláudio Emanuel Rodrigues, Aveiro (PT)

(73) Assignee: ALTICE LABS, S.A., Aveiro (PT)

( * ) Notice: Subject to any disclaimer, the term of this patent is extended or adjusted under 35 U.S.C. 154(b) by 171 days.

(21) Appl. No.: 15/320,259

(22) PCT Filed: Jun. 18, 2015

(86) PCT No.: PCT/PT2015/000029
§ 371 (c)(1),
(2) Date: Dec. 19, 2016

(87) PCT Pub. No.: WO2015/194982
PCT Pub. Date: Dec. 23, 2015

(65) Prior Publication Data
US 2017/0331558 A1    Nov. 16, 2017

(30) Foreign Application Priority Data
Jun. 19, 2014    (PT) .......................................... 107719

(51) Int. Cl.
*H01S 3/00*    (2006.01)
*H01S 3/08*    (2006.01)
(Continued)

(52) U.S. Cl.
CPC ......... *H04B 10/506* (2013.01); *H01S 3/0085* (2013.01); *H01S 3/08086* (2013.01);
(Continued)

(58) Field of Classification Search
CPC ...... H04B 10/40; H04B 10/506; H04B 10/70; H01S 3/0085; H01S 3/08086;
(Continued)

(56) References Cited

U.S. PATENT DOCUMENTS

| 5,612,968 A | 3/1997 | Zah |
| 7,965,949 B1 * | 6/2011 | Wach ..................... H04J 14/04 398/143 |

(Continued)

OTHER PUBLICATIONS

International Search Report and Written Opinion issued in International Patent Application No. PCT/PT2015/000029 dated Sep. 29, 2015.
(Continued)

*Primary Examiner* — Amritbir K Sandhu
(74) *Attorney, Agent, or Firm* — Arent Fox LLP

(57) ABSTRACT

The present invention provides a photonic integrated circuit, system, apparatus and method which can be used as an optical transmitter in a system, for example in a telecommunication system. According to the various embodiments of the invention, the circuit includes several optical devices, wherein some are passive and others have gain, which constructed and connected with the specific characteristics, leads to a multi-wavelength transmitter with tunable operation band.

5 Claims, 2 Drawing Sheets

(51) Int. Cl.
*H01S 3/13* (2006.01)
*H01S 3/23* (2006.01)
*H01S 5/00* (2006.01)
*H01S 5/14* (2006.01)
*H01S 5/40* (2006.01)
*H04B 10/50* (2013.01)
*H04B 10/70* (2013.01)

(52) U.S. Cl.
CPC .......... *H01S 3/1305* (2013.01); *H01S 3/2308* (2013.01); *H01S 5/4062* (2013.01); *H01S 5/4068* (2013.01); *H04B 10/70* (2013.01); *H01S 5/0085* (2013.01); *H01S 5/141* (2013.01); *H01S 5/4087* (2013.01)

(58) Field of Classification Search
CPC ...... H01S 3/1305; H01S 3/2308; H01S 5/141; H01S 5/4062; H01S 5/4068; H01S 5/4087; H01S 5/0085
USPC .................................................. 398/182, 200
See application file for complete search history.

(56) References Cited

U.S. PATENT DOCUMENTS

| | | | | |
|---|---|---|---|---|
| 8,644,714 | B2* | 2/2014 | Kwon | H01S 5/026 398/200 |
| 9,025,241 | B2* | 5/2015 | Asghari | H01S 5/02252 359/344 |
| 2005/0002424 | A1* | 1/2005 | Bernasconi | H01S 3/2383 372/20 |
| 2009/0059973 | A1* | 3/2009 | Suzuki | H01S 5/1032 372/20 |
| 2011/0038036 | A1* | 2/2011 | Todt | H01S 5/0264 359/341.1 |
| 2011/0310917 | A1* | 12/2011 | Krishnannoorthy | H01S 5/06821 372/23 |
| 2012/0163821 | A1 | 6/2012 | Kwon et al. | |

OTHER PUBLICATIONS

International Search Report and Written Opinion of International Patent Application No. PCT/PT2015/000029, dated Sep. 25, 2015.

* cited by examiner

PHOTONIC INTEGRATED TUNABLE MULTI-WAVELENGTH TRANSMITTER CIRCUIT

CROSS-REFERENCE TO RELATED APPLICATIONS

This application is a National Stage entry of International Application No. PCT/PT2015/000029, filed Jun. 18. 2015, which claims priority to Portuguese Patent Application No. PT107719 filed Jun. 19, 2014. The disclosures of the prior applications are hereby incorporated in their entirety by reference.

TECHNICAL DOMAIN OF THE INVENTION

The present invention relates to optical light generating systems, more particularly to telecommunication systems transmitters consisting of photonic integrated circuits, with tunable band and multi-wavelength.

SUMMARY OF THE INVENTION

This invention provides a photonic integrated system which works as a multi-wavelength transmitter with tunable band. This is composed by various filters, one for each band, which are connected to an amplifier or an optical switch each. All of the outputs from the amplifiers or optical switches are grouped in a multi-mode interferometer, and the result is routed to a multi-band filter. This generates the desired number of channels, in the respective band. After that, there is an amplifier in each output of the multi-band filter, followed by a power splitter with two outputs; the first output connects to a reflector, and the second is the exit from the laser cavity.

The light generated in this system can be sent to a plurality of modulators, one for each channel. The output of each modulator is connected to an optical multiplexer, which aggregates the channels that are then transmitted to a fiber that can be coupled to the photonic integrated circuit.

The invention allows transmitting several channels, wavelength multiplexed, in a plurality of different bands. This invention, incorporated as a multi-wavelength transmitter into a wavelength division multiplexing communications network based on optical fiber, is very useful according as it is possible to change the band where the information is being transmitted.

BACKGROUND OF THE INVENTION

Cloud computing, machine-to-machine, 3D formats, Audio and Video on Demand (AVOD) and mobility are some of the services, which have led to a rising demand for bandwidth. In this context, Full Service Access Network (FSAN) Group and International Telecommunication Union-Telecommunication Standardization Sector (ITU-T) have started to investigate new technologies for Next-Generation Passive Optical Networks 2 (NG-PON2). The main goal is to increase the bandwidth beyond the current 10 Gb/s downstream and 2.5 Gb/s upstream in the optical access network.

Among all the proposals, Time- and Wavelength-Division Multiplexed-PON (TWDM-PON) has stood out. In TWDM-PON, the aggregate rate is obtained by stacking several 10 Gigabit-PONs (XG-PONs), using different pairs of wavelength (upstream wavelength, downstream wavelength). For the concrete case where four XG-PONs are stacked, 40 Gb/s downstream and 10 Gb/s upstream are reached, i.e., four times the aggregate rate of the current PON.

The major challenges of planning this new architecture are the PONs coexistence and the equipment/infrastructure re-use. The spectrum is already occupied for other technologies, such as G-PON, XG-PON and Video. Therefore, the TWDM-PON has to take free spectrum bands in order to not interfere with other PONs. Besides, the TWDM-PON deployment cannot obligate to a total replacement of the already existing infrastructure. Efforts have to be made in the sense of re-using the existing equipment and infrastructures. This will cause a significant reduction of the costs.

The Photonic Integration will represent a huge breakthrough in terms of costs, since this will lead to higher density and lower power consumption. Several materials have been studied for photonic integration. Some of them are Silicon on Insulator (SOI), Silicon Nitride ($Si_3N_4$), Silicon Dioxide ($SiO_2$) and Indium phosphide (InP).

Taking all this in consideration, having a monolithic photonic integrated circuit, which comprises a TWDM-PON transmitter and is also capable of supporting all the current technologies, is a worth challenge.

DETAILED DESCRIPTION OF THE INVENTION

The following detailed description has references to the figures. Parts which are common in different figures have been refereed to using the same numbers. Also, the following detailed description does not limit the disclosure.

The present invention provides a photonic integrated system, apparatus, method and circuit which works as a multi-wavelength transmitter with tunable band. According to the embodiments of the invention, a plurality of laser sources are provided in the substrate; each of them generates a plurality of copies, and, with the enabling of a filter, it is possible to choose a specific operating band. The plurality of tunable lasers comprises a plurality of band-pass filters, which are connected to a reflector/reflective surface, on one side, and a plurality of optical switches/amplifiers, on the other side. The signal provided by the latter is aggregated in a power combiner, and then routed to a de-multiplexer, which has a single input and multiple outputs. Each output is connected to an amplifier, that is followed by a power splitter 1×2; one of its outputs is connected to a reflector/reflective surface, and the other one is the exit of the laser cavity. The generated light at the each laser cavity output can be sent to modulator. The output of each modulator is connected to an optical multiplexer, which aggregates the channels that are then transmitted to a fiber that can be coupled to the photonic integrated circuit.

Moreover, the invention allows generating and transmitting several channels, in a plurality of different bands, such as G-, XG- and TWDM-PON.

Figure 1:
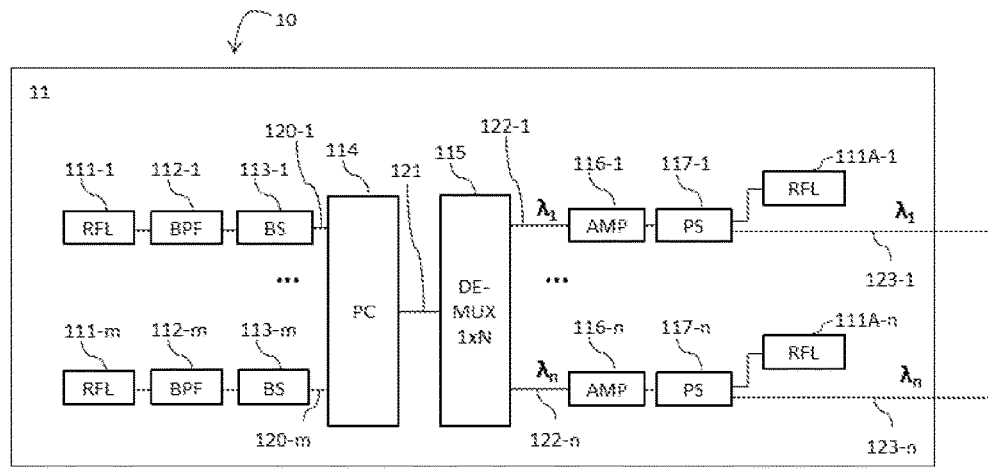
FIG. 1 is a schematic diagram of the photonic integrated circuit, according to certain aspects of the invention.

FIG. 1 illustrates the block diagram of an exemplary embodiment of a first photonic integrated circuit 10, which can be provided in a single substrate 11, preferably. The laser cavity is essentially composed by a variety of three elements, besides the required reflectors 111-1, 111-m; 111A-1, 111A-n. These elements are: N amplifiers 116-1, 116-n, being N the number of channels, M band-pass filters 112-1, 112-m, being M the number of desired operating bands, and a de-multiplexer 115 1×N. Furthermore, the mentioned reflectors 111-1, 111-m; 111A-1, 111A-n can be replaced by a reflective surface. The band-pass filter 112-1, 112-m, is tuned to a different operating band and connected to the de-multiplexer 115 through the power combiner 114 and the optical path 121. A specific operating band is selected by enabling the corresponding, herein called, band-selector 113-1, 113-m, and disabling the remaining ones. These band-selectors can be implemented by an amplifier and the enabling operation corresponds to drive the amplifier, in this case. Note that this is an exemplary embodiment for the said band-selector. This invention does not only comprise this solution but also all that use a mechanism, which prohibits the light to pass through an undesirable band-pass filter 112-1, 112-m, such as any other optical/electro-optical switch.

On its side, the de-multiplexer 115 separates each wavelength $\lambda_1$, $\lambda_N$ within the selected band, that reaches the de-multiplexer 115 input through the optical path 121, and provides each of them at the corresponding de-multiplexer 115 output, following the paths 122-1, 122-n. Due to the reflectors at the beginning of the path 120-1, 120-m, and at the end of the path 122-1, 122-n, these paths are bidirectional. A portion of the resulting light of the amplifier 116-1, 116-n driving reaches the reflector 111A-1, 111A-n, where it is reflected back to the amplifier 116, 116-n. Here it is amplified and follows the optical path 121-120 in direction to reflector 111-1, 111-m. The signal is reflected back in direction to the amplifier 116-1, 116-n, being amplified and transmitted to reflector 111A-1, 111A-n, once again. Meanwhile, the portion of the signal, which reaches the power splitter 1×2 117-1, 117-n and is not forwarded to the reflector 111A-1, 111A-n, follows the optical path 123-1, 123-n, i.e., the laser output. The constant amplifications and reflections, together with the filtering and de-multiplexing, will provide the channel $\lambda_1$, $\lambda_n$ at the optical path 123-1, 123-n. Since the photonic integrated circuit 10 comprises one amplifier 116-1, 116-n for each channel, the power of each one can be independently adjusted. This way, the channel, which may suffer a power decrease, e.g. due to filtering imperfections, can be amplified without affecting adjacent channels.

The photonic integrated circuit 10 is only an exemplary embodiment. Any change of this fundamental circuit is also covered, such as, the introduction of additional amplifiers/other elements or the elements location rearrangement.

Figure 2:
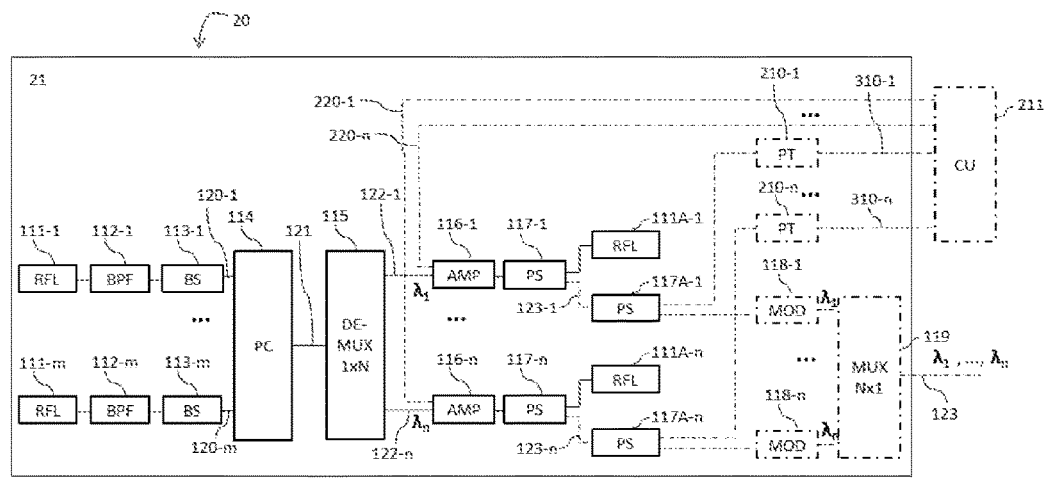
FIG. 2 is a schematic diagram of the photonic integrated circuit including a control unit, according to certain aspects of the invention.

FIG. 2 illustrates the block diagram of an exemplary embodiment of a second photonic integrated circuit 20, which can be provided in a single substrate 21, preferably. However, since photonic integrated circuit 20 is composed by two distinct sub-circuits, each of them can be provide in two substrates, for example.

One of the mentioned sub-circuits is the first photonic integrated circuit 10 with a slight difference. Besides the essential elements depicted in FIG. 1, photodiodes for laser monitoring were added. In this case, the portion of the light that reaches the power splitter 1×2 117-1, 117-n, and is not reflected in reflectors 111A-1, 111A-n, will be routed to a second power splitter 1×2 117A-1, 117A-n. The photodiode 210-1, 210-n, which is connected to one of the power splitter 1×2 117A-1, 117A-n outputs, will allow sampling the generated tunable laser signal. Posteriorly, the resulting electrical signal 310-1, 310-n can be used as an input signal of a control unit 211. Here, the electrical signal 310-1, 310-n will allow verifying if the tunable laser output signal meets the expectations. If it does not, the control unit 211 will change the driving signals 220-1, 220-n of the amplifiers 116-1, 116-n accordingly. Note that the power splitter 1×2 117-1, 117-n and the power splitter 1×2 117A-1, 117A-n are not necessarily equal. By that, one means that the splitting ration of both power splitters has not to be the same. For example, power splitter 1×2 117-1, 117-n can have a splitting ratio of 50/50, while the power ratio of the power splitter 1×2 117A-1, 117A-n can be 10/90. It depends on the portion of the light that is needed to be reflected and the one that is required for the monitoring system, which is composed by the photodiodes and the control unit.

The other mentioned sub-circuit, which is incorporated in photonic integrated circuit 20, relates to the modulation of the tunable laser outputs 123-1, 123-n of the photonic integrated circuit 10. The modulator 118-1, 118-n is connected to the other power splitter 1×2 117A-1, 117A-n output. The former modulates the signal according to a desired constellation.

The modulated signal follows the optical path 123A-1, 123A-n in direction to the multiplexer N×1, which multiplexes the N arriving signals into a single one that is transmitted to optical path 124, the output of the tunable transmitter. Note that, in certain cases, a polarization rotator or a similar compensation element may be needed wherever in the circuit. In spite of this is not shown in FIG. 2, the invention comprises this situation as well.

Moreover, the photodiode 210-1, 210-n can be introduced anywhere in the photonic integrated circuit 20. Instead of being introduced at the tunable laser output, the photodiode 210-1, 210-n can be placed, e.g., between the amplifier 116-1, 116-n and the power splitter 1×2 117-1, 117-n. The photonic integrated circuit 20 embodiment represented in FIG. 2 is an exemplary one. Therefore, it comprises location changes of its elements, as well. Since the photonic integrated circuit 20 comprises one amplifier 116-1, 116-n for each channel, the power of each one can be independently adjusted. Also, all channels $\lambda_1$, $\Delta_n$ can convey different information, simultaneously, because they are modulated by independent modulators 118-1, 118-n. However, it is also possible to reduce the number of modulators 118-1, 118-n if the channels can transmit the same information or if only one amplifier 116-1, 116-n is active at a time. The reduction of the number of modulators 118-1, 118-n implies the introduction of a power combiner Q×1 between the power splitter 1×2 117A-1, 117A-n and the mentioned modulator 118-1, 118-n, being Q the number of channels that can be modulated by a common modulator 118. In addition, a power splitter 1×Q has to be introduced, between the modulator 118-1, 118-n and the multiplexer N×1 119, in this case. Q value fits between 0 and N. If Q=0, all the channels should carry different information and a modulator is required for each channel, which is exactly the embodiment represented in FIG. 2. If Q=N, all the channels can be modulated with the same information, only one modulator 118 is required a power combiner N×1 is needed between the power splitter 1×2 117A-1, 117A-n and the mentioned modulator 118. If Q has another value within the interval [0, N], the number of modulators 118-1, 118-n has to be chosen accordingly. For example, if N=6 and Q=3, the number of modulators should be two and, in this case, each three channels of the total six can be modulated with the same information.

The photonic integrated circuit 20 is only an exemplary embodiment. Any change of this circuit is also covered, such as, the introduction of additional amplifiers/other elements or the elements location rearrangement.

Figure 3:
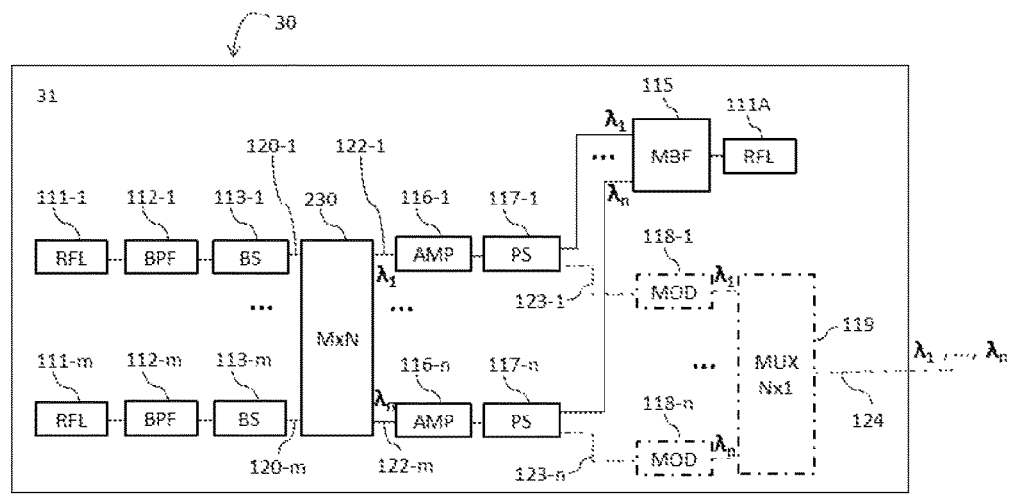
FIG. 3 is a schematic diagram of the photonic integrated circuit with some differences in its configuration, according to certain aspects of the invention.

FIG. 3 illustrates the block diagram of an exemplary embodiment of a third photonic integrated circuit 30, which can be provided in a single substrate 31, preferably. However, since photonic integrated circuit 30 is composed by two distinct sub-circuits, each of them can be provided in a different substrate, for example, as with photonic integrated circuit 20.

Comparatively to the photonic integrated circuit 20, the photonic integrated circuit 30 can be decomposed into the tunable laser cavity and the modulation sub-circuit. The former is similar to the photonic integrated circuit 10, except the de-multiplexer 1×N 115 location. In photonic integrated circuit 10, the de-multiplexer 1×N 115 is located between the power combiner M×1 114 and the amplifier 116-1, 116-n, while in photonic integrated circuit 30, this element (115) is introduced between the power splitter 1×2 117-1, 117-n and the reflectors 111A-1, 111A-n. Consequently, the power combiner M×1 114 has to be replaced by a similar element 230 with N outputs, rather than a single one. Note that this element (230) is not neglected in any case, even when the number of the bands M is equal to the number of channels N. The function of both power combiner 114 and 230 is to guaranty that the signal, which travels through any selected optical path 120-1, 120-n (by enabling the corresponding, herein called, band-selector 113-1, 113-m), reaches every amplifier 116-1, 116-n.

In spite of this modification, the operation principle described for photonic integrated circuit 10 remains unchanged. The tunable laser output signals are generated, mainly, due to the constant amplifications and reflections that the light experiences in the amplifier 116-1, 116-n and in the reflectors (or reflective surfaces) 111-1, 111-m, 111A-1, 111A-n, respectively. Similarly to the photonic integrated circuit 10, in the photonic integrated circuit 30, the tuning process is dictated by the combination of the band-pass filter 112-1, 112-m that has been selected and the de-multiplexer 1×M 115.

As it can be seen in FIG. 3, the photodiode 210-1, 210-n, together with the control unit 211, is omitted. This omission has only to do with maintaining a good readability of the block diagram. The photodiode 210-1, 210-n for monitoring, and consequently, the control unit 221, can also be introduced at any point of the photonic integrated circuit 30, as in photonic integrated circuit 20.

The modulation sub-circuit of photonic integrated circuit 30 does not differ from that of the photonic integrated circuit 20. It is composed by modulators 118-1, 118-n and a multiplexer N×1 119, which multiplexes the channels $\lambda_1$, $\lambda_n$ that travels through the optical paths 123-1 to 123-n into the multi-wavelength transmitter output 124. The modulators are connected to one of the power splitter 1×2 117-1, 117-n outputs, in case of photodiodes 210-1, 210-n are not introduced at the tunable laser cavity output. In this case, the modulators are connected to one of the power splitter 1×2 117A-1, 117A-n outputs, as it was illustrated in the case of the photonic integrated circuit 20.

Note that, in certain cases, a polarization rotator or a similar compensation element may be needed wherever in the circuit. In spite of this is not shown in FIG. 3, the invention comprises this situation as well.

Since the photonic integrated circuit 20 comprises one amplifier 116-1, 116-n for each channel $\lambda_1$, $\lambda_n$, the power of each one can be independently adjusted. Also, all channels $\lambda_1$, $\lambda_n$ can convey different information, simultaneously, because they are modulated by independent modulators 118-1, 118-n. However, it is also possible to reduce the number of modulators 118-1, 118-n if the channels can transmit the same information or if only one amplifier 116-1, 116-n is active at a time. The reduction of the number of modulators 118-1, 118-n implies the introduction of a power combiner Q×1 between the power splitter 1×2 117A-1, 117A-n and the mentioned modulator 118-1, 118-n, being Q the number of channels that can be modulated by a common modulator 118. In addition, a power splitter 1×Q has to be introduced, between the modulator 118-1, 118-n and the multiplexer N×1 119, in this case. Q value fits between 0 and N. If Q=0, all the channels should carry different information and a modulator is required for each channel, which is exactly the embodiment represented in FIG. 3. If Q=N, all the channels can be modulated with the same information, only one modulator 118 is required a power combiner N×1 is needed between the power splitter 1×2 117A-1, 117A-n and the mentioned modulator 118. If Q has another value within the interval [0, N], the number of modulators 118-1, 118-n has to be chosen accordingly. For example, if N=6 and Q=3, the number of modulators should be two and, in this case, each three channels of the total six can be modulated with the same information.

The photonic integrated circuit 30 is only an exemplary embodiment. Any change of this circuit is also covered, such as, the introduction of additional amplifiers/other elements or the elements location rearrangement.

Figure 4:
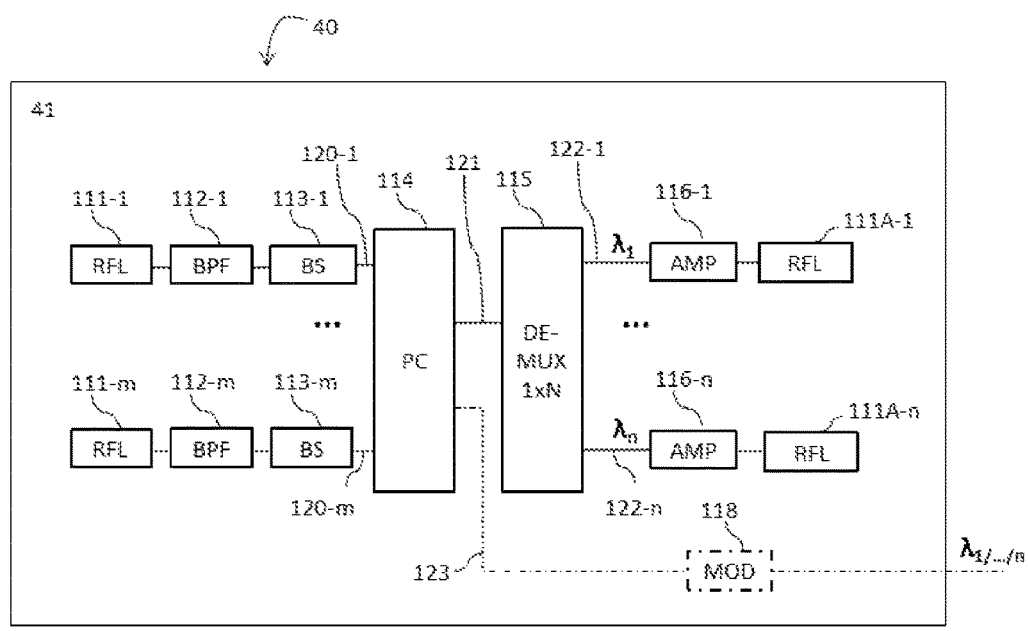
FIG. 4 is a schematic diagram of another photonic integrated circuit, according to certain aspects of the invention.

FIG. 4 illustrates the block diagram of an exemplary embodiment of a fourth photonic integrated circuit 40, which can be provided in a single substrate 41, preferably. However, since photonic integrated circuit 40 is composed by two distinct sub-circuits, each of them can be provided in a different substrate, for example, as with photonic integrated circuit 20.

Comparatively to the photonic integrated circuit 20, the photonic integrated circuit 40 can be decomposed into the tunable laser cavity and the modulation sub-circuit. The former is similar to the photonic integrated circuit 10, except the number and location of the laser cavity outputs 123-1, 123-n. In the photonic integrated circuit 40, the laser cavity output is only one, rather than N, as in the photonic integrated circuit 10. The number was reduced due to the localization change. In photonic integrated circuit 10, the optical path 123-1, 123-n is an extension of one of the power splitter 1×2 117-1, 117-n output, while in photonic integrated circuit 40, the optical path 123 is located between the de-multiplexer 1×N 115 and the power combiner 114, which has to be replace by a similar element 240, in photonic integrated circuit 40, with the same number of inputs but with two outputs.

In spite of this modification, the operation principle described for photonic integrated circuit 10 remains unchanged. The tunable laser output signal is generated, mainly, due to the constant amplifications and reflections that the light experiences in the amplifier 116-1, 116-n and in the reflectors (or reflective surfaces) 111-1, 111-m, 111A-1, 111A-n, respectively. Similarly to the photonic integrated circuit 10, in the photonic integrated circuit 40, the tuning process is dictated by the combination of the band-pass filter 112-1, 112-m that has been selected and the de-multiplexer 1×M 115.

As it can be seen in FIG. 4, the photodiode 210-1, 210-n, together with the control unit 211, is omitted. This omission has only to do with maintaining a good readability of the block diagram. The photodiode 210-1, 210-n for monitoring, and consequently, the control unit 221, can also be introduced at any point of the photonic integrated circuit 40, as in photonic integrated circuit 20.

The modulation sub-circuit of photonic integrated circuit 40 is composed by only one modulator 118, since there is only one output laser cavity. Thus, if all the gain regions 116-1, 116-n are driven simultaneously, all channels $\lambda_1$, $\lambda_n$ will convey the same information.

Note that, in certain cases, a polarization rotator or a similar compensation element may be needed wherever in the circuit. In spite of this is not shown in FIG. 2, the invention comprises this situation as well.

Since the photonic integrated circuit 40 comprises one amplifier 116-1, 116-n for each channel $\lambda_1$, $\lambda_n$, the power of each one can be independently adjusted.

The photonic integrated circuit 40 is only an exemplary embodiment. Any change of this circuit is also covered, such as, the introduction of additional amplifiers/other elements or the elements location rearrangement.

The invention claimed is:

1. A photonic integrated circuit comprising:
    a substrate;
    a first plurality of reflectors provided in the substrate and disposed at the end of each laser cavity;
    a plurality of band-pass filters provided in the substrate and connected to the first plurality of reflectors, wherein each of the plurality of band-pass filters is configured to operate in a respective band;
    a plurality of band selectors provided in the substrate, wherein each one of the plurality of band selectors is connected to each of the plurality of band-pass filters to enable or disable the respective band;
    a power combiner provided in the substrate that aggregates the first plurality of reflectors, the plurality of band-pass filters, and the plurality of band selectors in one optical path;
    multi-band filter provided in the substrate having one input connected to an output of the power combiner and a plurality of outputs;
    a plurality of amplifiers provided in the substrate, wherein each one of the plurality of amplifiers is connected to one output of the plurality of outputs of the multi-band filter;
    a plurality of power splitters provided in the substrate each having an input connected to each of the plurality of amplifiers and two outputs;
    a second plurality of reflectors provided in the substrate and connected to one of the outputs of each of the plurality of power splitters.

2. The photonic integrated circuit of claim 1, wherein
    each of the first plurality of reflectors comprises a multimode interferometer reflector (MIR) or an optically reflective surface or
    each of the plurality of band-pass filters comprises an arrayed waveguide grating (AWG), a Bragg grating, or a ring resonator or
    each of the plurality of band selectors comprises an optical switch, a semiconductor optical amplifier (SOA), or an erbium-doped amplifier or
    the multi-band filter comprises an arrayed waveguide grating (AWG) or
    each of the plurality of amplifiers comprises a semiconductor optical amplifier (SOA) or an erbium-doped amplifier.

3. The photonic integrated circuit of claim 1, wherein the power combiner comprises a multi-mode interferometer (MMI) or each of the plurality of power splitters comprises a multi-mode interferometer (MMI).

4. The photonic integrated circuit of claim 1, further comprising:
    a plurality of modulators provided in the substrate each connected to one of the two outputs of the plurality of power splitters;
    a multiplexer provided in the substrate, wherein the multiplexer includes a plurality of inputs connected to the outputs of the plurality of modulators and one output; or
    wherein each modulator comprises a Mach-Zehnder modulator.

5. The photonic integrated circuit of claim 1, further comprising an electronic control unit that monitors, through a plurality of photodetectors, the optical signal delivered to the plurality of modulators and enables or disables the plurality of band selectors, the electronic control unit is configured to allow a selection of the operation band, wherein each of the plurality of photodetectors comprises a PIN photodiode or an avalanche photodiode (APD).

* * * * *